(12) United States Patent
Peel et al.

(10) Patent No.: US 9,764,641 B2
(45) Date of Patent: Sep. 19, 2017

(54) SYSTEM AND METHOD FOR DETERMINING A VEHICLE BATTERY STATUS

(71) Applicant: Medallion Instrumentation Systems, LLC, Spring Lake, MI (US)

(72) Inventors: Ronald B. Peel, Whitehall, MI (US); Michael J. Sims, Zeeland, MI (US); Michael J. Laeder, Spring Lake, MI (US)

(73) Assignee: Medallion Instrumentation Systems LLC, Spring Lake, MI (US)

( * ) Notice: Subject to any disclaimer, the term of this patent is extended or adjusted under 35 U.S.C. 154(b) by 190 days.

(21) Appl. No.: 14/746,333

(22) Filed: Jun. 22, 2015

(65) Prior Publication Data

US 2015/0367733 A1 Dec. 24, 2015

Related U.S. Application Data (60) Provisional application No. 62/015,754, filed on Jun. 23, 2014, provisional application No. 62/138,164, filed on Mar. 25, 2015.

(51) Int. Cl.
*H01M 10/46* (2006.01)
*B60K 37/02* (2006.01)
(Continued)

(52) U.S. Cl.
CPC .......... *B60K 37/02* (2013.01); *G01R 31/3682* (2013.01); *G01R 31/3689* (2013.01);
(Continued)

(58) Field of Classification Search
CPC ................ H02J 7/355; H02J 7/0021
(Continued)

(56) References Cited

U.S. PATENT DOCUMENTS

| 6,988,053 B2 * | 1/2006 | Namaky | G01R 31/007 320/104 |
| 2001/0033169 A1 * | 10/2001 | Singh | G01R 31/3662 324/426 |

(Continued)

OTHER PUBLICATIONS

Intelligent Battery Sensor with CAN and LIN, Freescale Semiconductor, Advance Information, 2013-2014.
(Continued)

*Primary Examiner* — Edward Tso
(74) *Attorney, Agent, or Firm* — Warner Norcross & Judd LLP (57) ABSTRACT

A battery indicator system for a vehicle. In one embodiment, the battery indicator system includes a power port for the vehicle, the power port having a socket and battery monitor in electrical communication with a power source on a vehicle. The battery monitor is operable in a status mode in which it indicates or communicates to an indicator at least one of the state of charge and the state of health of the power source on the vehicle while a device is being charged or powered via the power port. The power port can include an integrated indicator, such as one or more lighting elements. The power source can provide power to the device to charge and/or power the device and provides power to the battery monitor so that a viewer of the port can easily monitor the status of the charge of the power source itself (versus the charging status of the device) via the power port to ensure the power source is not inadvertently drained. In one embodiment, the battery monitor can be mounted to the power source separate from the power port, and communicate at least one of the state of charge and state of health information for display on an indicator.

30 Claims, 8 Drawing Sheets

(51) Int. Cl.
*G01R 31/36* (2006.01)
*H02J 7/00* (2006.01)

(52) U.S. Cl.
CPC .... *H02J 7/0047* (2013.01); *B60K 2350/1056* (2013.01); *B60K 2350/1076* (2013.01); *B60K 2350/307* (2013.01)

(58) Field of Classification Search
USPC ......... 320/107, 111, 112, 132, 149; 324/426, 324/427, 433
See application file for complete search history.

(56) References Cited

U.S. PATENT DOCUMENTS

| | | | | |
|---|---|---|---|---|
| 2005/0162124 A1* | 7/2005 | Bertness | ............... | H02J 7/0054 320/105 |
| 2006/0071631 A1* | 4/2006 | Cheung | ................ | H02J 7/0054 320/105 |
| 2013/0257346 A1* | 10/2013 | Jakins | ................... | H02J 7/0044 320/107 |

OTHER PUBLICATIONS

Derek Plug-In Socket Convertor and Monitor, downloaded from http://www.derek.com.au/12volt.html at least as early as May 8, 2014.
Wonmeter, downloaded from http://www.wonmeter.com/bmz_cache/1/1427ada7cc88813b0f0e4a8928c2fae.image.500x500.jpg at least as early as May 8, 2014.

\* cited by examiner

SYSTEM AND METHOD FOR DETERMINING A VEHICLE BATTERY STATUS

BACKGROUND OF THE INVENTION

The present invention relates to a battery indicator system, and more particularly to charging plugs on recreational vehicles and/or a gauge to indicate status information, such as state of charge or state of health, or both, about a power source on a recreational vehicle.

Many vehicles come with a 12 volt charging receptacle or port. These ports are usually configured to transfer power from the vehicle to a device plugged into the port with a connector. This power transfer is usually performed to charge devices that are external to the vehicle. As an example, a mobile phone or laptop can include a rechargeable battery. A cable and associated plug can be connected to the device. The plug can be plugged into the port. Usually the port will enable the power source on the vehicle to transfer power to the plug, through the cable to ultimately recharge the mobile device battery.

An issue with charging mobile devices from a port on a smaller vehicle, such as a recreational vehicle, can be that use of one or more vehicle systems can drain the power source, for example, the vehicle battery to the point that the vehicle can no longer start or operate. Power drain during operation can sometimes cause the engine stall. Examples of vehicle systems or hardwired systems that may cause such power drain include a stereo amplifier, a spot light, a snow plow, or a winch. The charging of an external device may also drain the power source or contribute to parasitic loss to the point that the vehicle can no longer start or operate. Power drain on a power source can, in some cases, leave the operator of the vehicle stranded, which is of course unsatisfactory.

Accordingly, there remains room for improvement in connection with charging ports on vehicles, particularly with regard to smaller recreational type vehicles.

SUMMARY OF THE INVENTION

A battery indicator system for a vehicle. In one embodiment, the battery indicator system includes a power port for a vehicle, the power port having a socket and a state of charge gauge in electrical communication with a power source on the vehicle. The gauge is operable in a status mode in which it indicates the state of charge of the power source on the vehicle while an item is being charged or powered via the power port.

In one embodiment, the power source provides voltage to the item to charge or power the item and provides voltage to the gauge so that a viewer of the port can easily monitor the status of the charge of the power source itself (versus the charging status of the item) via the gauge to ensure the power source is not inadvertently drained.

In another embodiment, the gauge in the status mode provides visual output, via one or more indicators, as to the status of the charge of the power source of the vehicle. The indicator can be a lighting element that selectively illuminates in a manner to indicate charge of the power source of the vehicle. For example, many lighting elements can be illuminated when the battery charge is near 100%, and fewer lighting elements can be illuminated when the battery charge is less than that amount. It should be understood that the present disclosure is not limited to use of lighting elements, and that any type of indicator can be used, including, for example, an LCD display, a TFT display, a mechanical gauge, an audible indicator, or a haptic indicator, or a combination thereof.

In still another embodiment, the socket includes a longitudinal axis, and a housing defining an internal bore sized and shaped to receive a corresponding plug of an item to be charged.

In yet another embodiment, the socket includes a moveable element joined with the socket and configured to maintain the socket in a fixed orientation relative to the vehicle, for example, by securing the socket fixedly to a panel of the vehicle.

In even another embodiment, the gauge includes a lighting element. In the status mode, the lighting element selectively illuminates to indicate the state of charge of the power source on the vehicle.

In a further embodiment, a recreational vehicle is provided including a power source, for example a battery, an electrical system in communication with the socket. The socket also includes the state of charge gauge, which is operable in a status mode in which it indicates the state of charge of the power source on the vehicle while an item is being charged via the power port.

In still a further embodiment, a method of charging a device is provided. The method can include: plugging a connector of the device into a socket on a mobile vehicle, the socket in electrical communication with a battery on the vehicle, the socket including a state of charge gauge; charging and/or operating the device with the battery on the vehicle; and outputting the status of the battery via the state of charge gauge while the device is charging and/or operating under voltage from the battery. Optionally, a viewer can monitor the status of the charge of the battery via the gauge to ensure the battery is not inadvertently drained.

In yet a further embodiment, a battery indicator system is provided for a vehicle. The battery indicator system includes a battery clamp mounted to a battery and having a battery monitor configured to monitor one or more characteristics of the battery. The battery monitor can determine, based on the one or more monitored characteristics, at least one of a battery state of charge and a battery state of health. The battery clamp can communicate battery related information for display on an indicator, where the battery related information can include at least one of the battery state of charge and the battery state of health. In one embodiment, the battery clamp can be mounted directly to a terminal of the battery (e.g., the negative terminal). The one or more monitored characteristics can include a battery, temperature, a battery voltage across the positive and negative terminals of the battery, and a battery current between the negative terminal and a vehicle chassis ground.

These and other objects, advantages, and features of the invention will be more fully understood and appreciated by reference to the description of the current embodiment and the drawings.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

DETAILED DESCRIPTION OF THE CURRENT EMBODIMENTS

A power port of a current embodiment is illustrated in FIGS. 1-4 and generally designated 10. The power port 10 can generally be utilized in connection with a vehicle, such as a utility vehicle shown in FIG. 5. Of course, the power port 10 can be utilized in connection with any type of recreational or other vehicle, such as a snowmobile 100A, an off road vehicle 100B, a recreational motorhome 100C, a watercraft or boat 100D, a personal watercraft 100E, a tractor 100F, or any other type of vehicle that may include a power port or plug into which an external item, such as a mobile device, can be plugged for charging and/or powering of the device.

Figure 4:
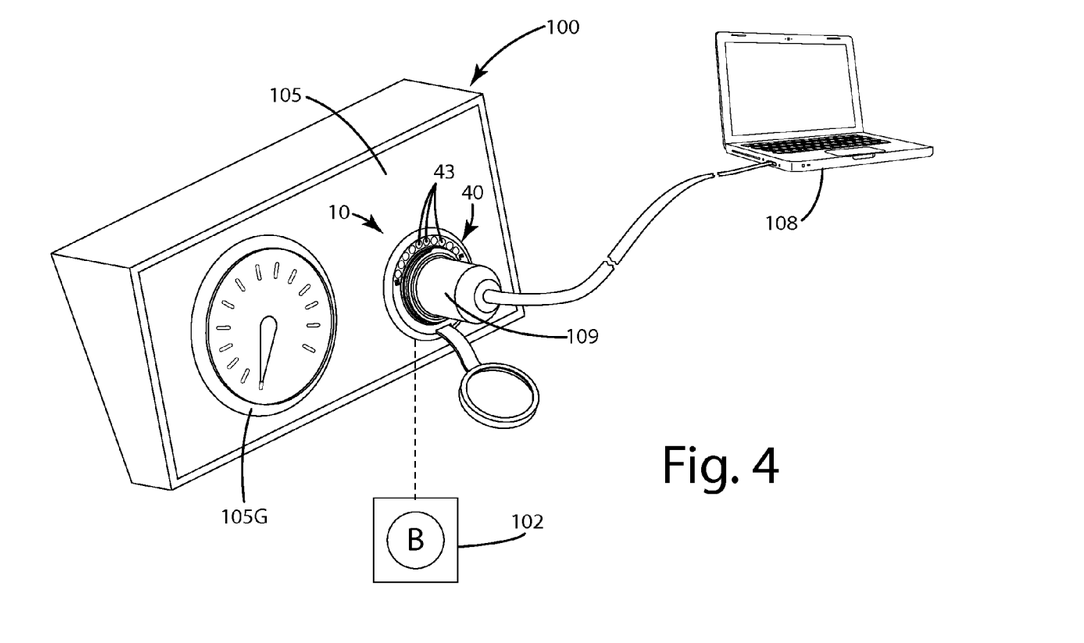
FIG. 4 is a perspective view of the power port in an instrumentation panel of a vehicle, while a connector of a device is plugged into the socket to charge and/or power the device.

The power port 10 can include a socket 20 which can define a longitudinal axis LA. The socket can be in electrical communication with a power source 102 of a vehicle 100. The power source can be a vehicle battery, such as a conventional 12 volt or 6 volt battery. The socket 20 can be sized so that its bore 23 receives a plug or connector 109. The plug or connector 109 can be in electrical communication with an item to be charged or powered 108 as shown in FIG. 4. That item can be a laptop computer. Of course, other types of items can be powered or charged using the power port 10. For example, the item can be a cellular phone, a personal computing device, a GPS, a light, a horn, a transceiver, a receiver, a radio, and/or any other type of device having a rechargeable battery. The item can also be a battery or set of batteries, in which case, the connector 109 can plug into a battery charger outlet to charge the battery or set of batteries.

The power port and/or socket can include a state of charge gauge 40. The gauge 40 is in electrical communication, for example, by wiring, with a power source of the vehicle, such as a battery. The gauge 40 can interface with an indicator to display information, such as information related to a battery state of charge or a battery state of health. The indicator can be incorporated into the gauge 40 or can be separate from the gauge 40. Additionally, the indicator can be any type of component capable of providing information to a vehicle operator, including one or more lighting elements (e.g., a light emitting diode (LED) display or an LED array), a liquid crystal display (LCD), a mechanical gauge (e.g., a mechanical meter), an audible indicator, a haptic indicator, a thin film transistor (TFT) display, or a combination thereof. In the illustrated embodiment, the gauge 40 includes an indicator formed of one or more lighting elements 43. The gauge can be operable in a status mode, in which the lighting elements selectively illuminate to indicate the state of charge of the power source of the vehicle (versus the state of charge of the power source and/or the state of charge of the item being charged or powered by the power port). In operation, the power source of the vehicle can provide a voltage and/or electrical current to the device. The power source also provides voltage and/or electrical current to the gauge so that the gauge can output information via the lighting elements whereby a viewer of the gauge can monitor the status of the charge of the power source by way of the gauge to insure that the power is not inadvertently drained. This can prevent a situation where a user inadvertently powers or charges a device having a draw on the vehicle battery 102, which in turn draws down the battery to such a point that it can no longer be used to start or operate the vehicle 100. This can sometimes leave a user stranded, particularly where they are in a remote location. For purposes of disclosure, the power port and/or socket in the illustrated embodiment is described in connection with having a gauge 40 with one or more lighting elements 43; however, it should be understood that the power port and/or socket is not so limited, and that the gauge 40 can interface with any indicator, incorporated into or separate from the gauge 40. Further, the gauge 40 may be separate from the power port and/or socket.

Figure 3:
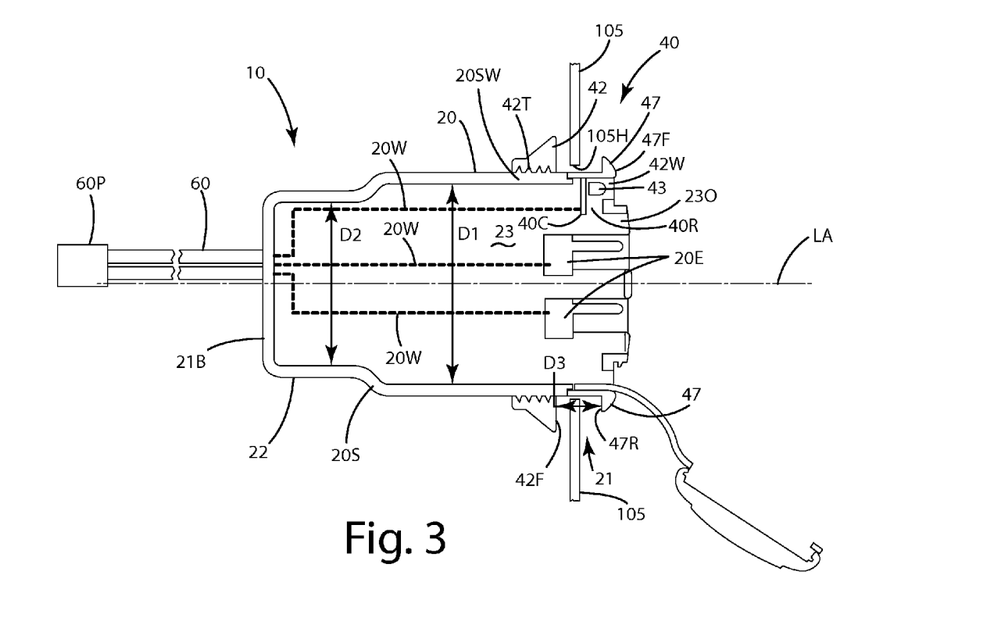
FIG. 3 is a cross section of the socket and state of charge gauge.

The different components of the power port 10 will now be described in more detail. As mentioned above, the power port shown in FIGS. 1-4 includes a socket 20. The socket 20 defines an internal bore 23 having an opening 23O at a first end 21. The first end 21 can be located somewhat external to the panel 105 of the vehicle 100. The internal bore and/or socket can be of a generally cylindrical shape. If desired, the walls of the cylinder can be stepped and/or tapered. This is illustrated in FIG. 3. There, the first end 21 can be adjacent the opening 23O. The second end 22 can be distal from the first end 21. The second end 22 can include a closed bottom 21B, closing off that end of the socket 20. This can close the socket to the environment except for the opening 23O.

The socket itself can be of a tubular, cylindrical construction with a reduced size cylindrical portion at the second end 22. In general, the first portion of the socket near the opening 23O can include a first dimension D1. This dimension can be in the form of a diameter or other dimension, depending on the cross sectional shape of the socket. The diameter can be about ¼ inches to about 2 inches, optionally about ¾ inches to 1 inch. The second portion of the socket 20 near the second end 22 can include a second dimension D2 which also can correspond to a diameter. Optionally, the diameter D2 can be about 10%-25%, further optionally 15% smaller than the dimension D1. At the transition from the first dimension D1 to the second dimension D2, the socket 20 can include a recessed shoulder 20S that smoothly transitions the socket inner dimensions between one another. These reduced dimensions can be reflected or shown in the exterior of the socket.

The socket 20 optionally can include a threaded portion 21T. This threaded portion 21T can be located adjacent the first end 21 adjacent the opening 23O. This threaded portion 21T can optionally be threaded to receive an annular ring 42 thereupon. The annular ring 42 can include threads 42T that mesh with the threads 21T. The socket and/or gauge can include a trim element 47. This trim element can generally circumferentiate the socket. Of course, if desired, the trim element can be of different shapes other than a ring shape. For example, it can be square, rectangular, polygonal or other shapes depending on the desired look of the exposed portion of the power port. Likewise, the ring 42 can be modified in size and shape.

The ring 42 can be threaded relative to the socket sidewall 20SW so that it selectively advances toward the trim element 47 upon tightening of the same. Optionally, the ring can be tightened relative to the socket so that the front face 42F of the ring 42 advances toward the rear surface 47R of the trim element 47. In this manner, the distance D3 can be selectively decreased. The amount of decrease in this distance D3 can depend on the thickness of the panel that is placed between the trim element 47 and the ring 42. Generally, the ring 42 can be tightened sufficiently so that the panel is clamped and/or sandwiched between the ring 42 and the trim element 47. This can provide a secure mounting of the power port to the panel 105 of the vehicle to prevent it from accidentally dislodging or becoming damaged.

The trim element 47 can also include an exterior or front surface 47F. Generally, this front surface is aesthetically pleasing, because it is usually exposed on the front side of the panel or the exposed side of the panel 105. The trim element can be of sufficient size so that it overlaps and conceals a hole 105H in the panel 105 as shown in FIG. 3. Either one or both of the trim element 47 and the ring 42 can include a sealing member, such as a polymeric, rubber, silicone, composite or other type of washer, to prevent liquid from leaking from the panel 105 through the hole 105H and behind the panel.

The socket 20 also can include electrodes 20E that are configured to engage a plug or connector 109 when the plug or connector is installed in the socket, and in particular the internal bore 23. These electrodes 20E can be in electrical communication with the vehicle battery 102 via wiring 20W. This wiring 20W can exit the second end 22 or closed bottom 21B of the power port. External wiring 60 can be in electrical communication with this wiring 20W. This external wiring can connect to the electrical system of a vehicle, optionally, via a plug 60P being plugged into the same, and ultimately to the vehicle battery 102.

Returning to FIGS. 2-4, the socket 20 can include a socket cover 20C. The socket cover can be attached via a strip or other piece of material to the socket, gauge and/or flange. This cover 20C can be constructed from a rubber, elastomeric or other polymeric material and configured to close off and cover the opening 23O at the first end 21 of the socket 20. Optionally, the first end 21 and in particular the threaded portion 21T can extend externally relative to the gauge 40 to provide a raised surface on which the exterior of the cover 20C can be disposed and generally secured to.

Figure 1:
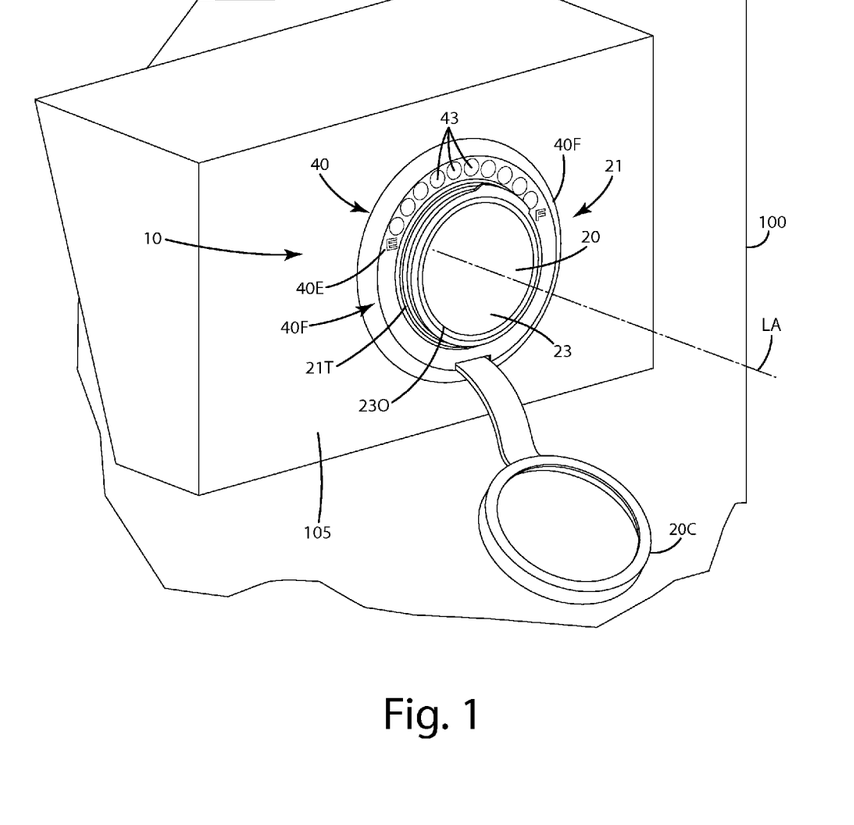
FIG. 1 is a power port of a current embodiment, including a state of the charge gauge, installed in a vehicle panel.
Figure 2:
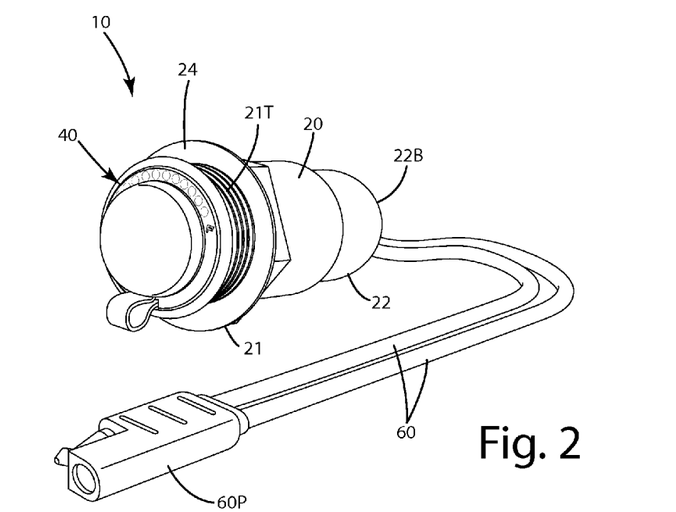
FIG. 2 is a perspective view of the socket and state of the art gauge removed from a panel and unpowered.

The power port 10 includes a state of charge gauge 40 as mentioned above. The gauge can include the trim element 47 that again conceals the hole 105H in the panel 105. The gauge 40 can include one or more lighting elements 43. As shown in FIGS. 1 and 3, those lighting elements 43 can be in the form of multiple LEDs or OLEDs, which can be selectively illuminated. Alternatively, these LEDs can be replaced with an LCD. Alternatively, multiple independent conventional fluorescent or incandescent lighting elements can be used as lighting elements 43. As described herein, the one or more lighting elements 43 may be any type of indicator, such as an LCD, a mechanical gauge (e.g., a mechanical meter), an audible indicator, a haptic indicator, and a thin film transistor (TFT) display, or a combination thereof. The indicator can be separate from or incorporated into the state of charge gauge 40 of the power port 10; further, the indicator can be included in the power port 10 separate from the gauge 40. Alternatively, or additionally, the state of charge gauge 40 can be separate from the power port 10.

As illustrated in FIG. 1, the lighting elements 43 can be disposed in an array. The array can circumferentiate or at least traverses in an arc around part of the port and/or the opening 23O of the socket 20. Of course, the gauge can be configured so that the array of lighting elements 43 is of a linear, straight and uncurved configuration to illustrate the state of charge of the battery of the vehicle. The lighting elements can be void of any type of (and the power port itself can be void of any type of) alphanumeric output elements that indicate the state of charge of the battery. Optionally, although indicia elements such as empty and full status indicators 40E and 40F can be included on the front face 40F of the gauge 40. These empty and full status indicators can be in the form of alphanumeric text that is readable by a user to discern the stated charge of the battery of the vehicle. These indicators can be separate from the lighting elements if desired, and can be non-illuminated.

The lighting elements 43 can alternatively be arranged as multiple bars. For example, one bar might be associated with a low state of charge, another associated with a medium state of charge and another associated with a full state of charge. Various output configurations can be utilized.

As shown in FIG. 3, the gauge 40 can include a recess 40R. The lighting elements 43 can be disposed in the recess 40R. The lighting elements 43 can be protected by a translucent or transparent exterior window 42W that is disposed adjacent the recess 40R and that transitions to the front face 40F of the gauge 40. The lighting elements 43 themselves can be mounted to a support structure such as a circuit bored 40C. The circuit board can include circuitry that can sense or compute the voltage, electrical current, or other electrical properties of the power being supplied to the power port, generally from the battery of the vehicle. The circuitry can adjust the number of lighting elements illuminated, or otherwise adjust the lighting elements to indicate the precise state of charge of the battery of the vehicle. As an example, when the battery is at full charge and/or charging well, all of the lighting elements 43 are illuminated as shown in FIG. 1. Where the battery of the vehicle becomes significantly drained during a charging operation, particularly where the vehicle is turned off and not being recharged by the engine of the vehicle, the gauge 40 and circuitry can illuminate only a few or less than all of the lighting elements 43. Thus, the gauge outputs to a user a visual cue that the battery is being drained and/or nearing an empty or depleted charge. In turn, a user can take corrective action to either start the vehicle or discontinue charging or use of the item which is plugged into the power port 10.

Generally, the gauge 40 can provide generic visual output to a user as to the state of charge of the battery without anything plugged into the socket. This can potentially warn a user before embarking on a long trip that the battery may already be being depleted—even if a connector is not plugged into the socket 20. Further, the gauge and/or circuitry 40C can compute the voltage or other electrical data based on the voltage of the battery or current supplied by the battery, or both. It can output that information to the lighting elements to inform a user to the state of charge of the battery.

Figure 7:
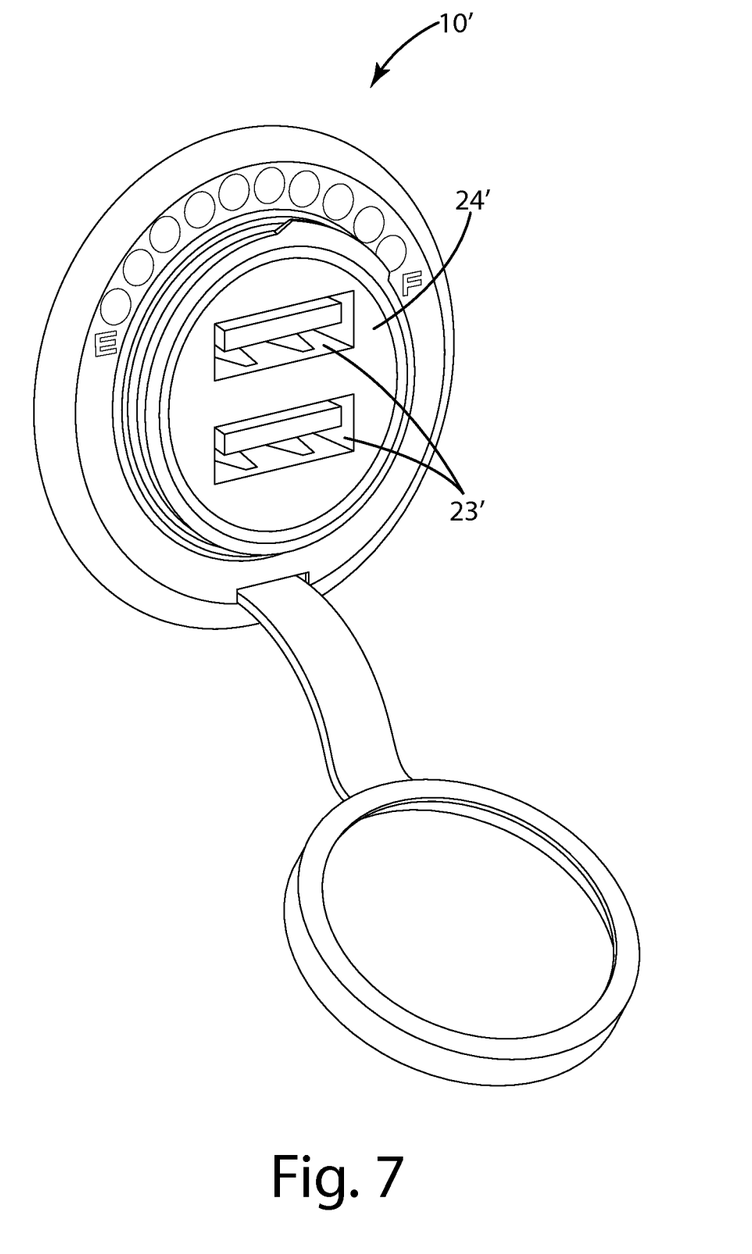
FIG. 7 is a perspective view of a first alternative embodiment of the port including USB ports.

Optionally, although shown with a socket defining an internal bore 23, the power port can be outfitted with one or more USB charging sub ports 23' as shown in FIG. 7. This alternative embodiment includes a plug 24' that is basically screwed into or otherwise joined with the power port 10'. This plug or component 24' can define one or more USB ports 23' to charge items that include USB connections. Alternatively, if desired, the USB ports 23' can be converted to multi-pin connectors, cables, or any other connectors used in conventional charging or powering constructions, including industry standard connections.

Figure 5:
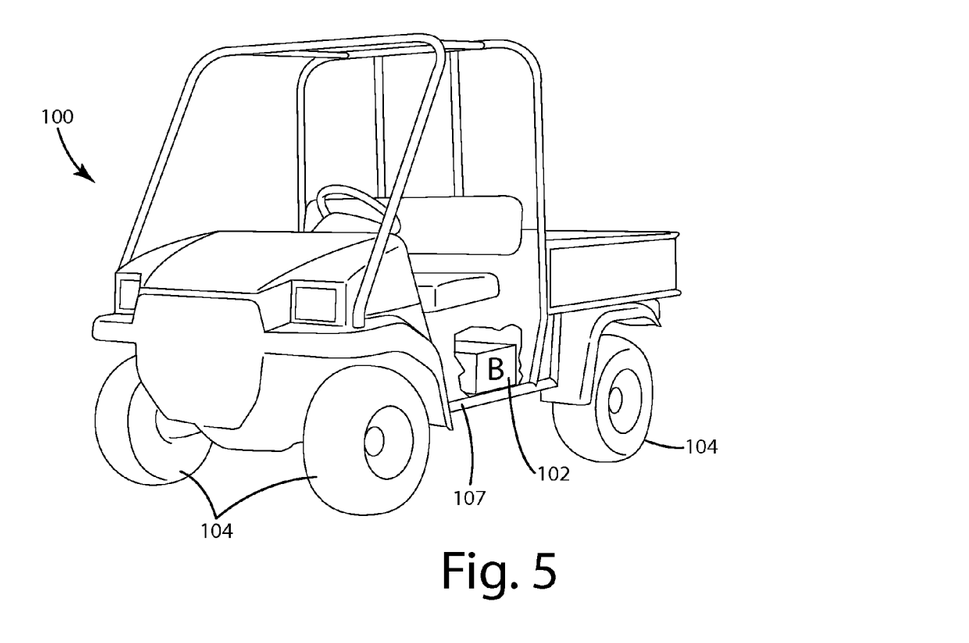
FIG. 5 is a perspective view of an exemplary vehicle in which the port of the current embodiment can be utilized.
Figure 6:
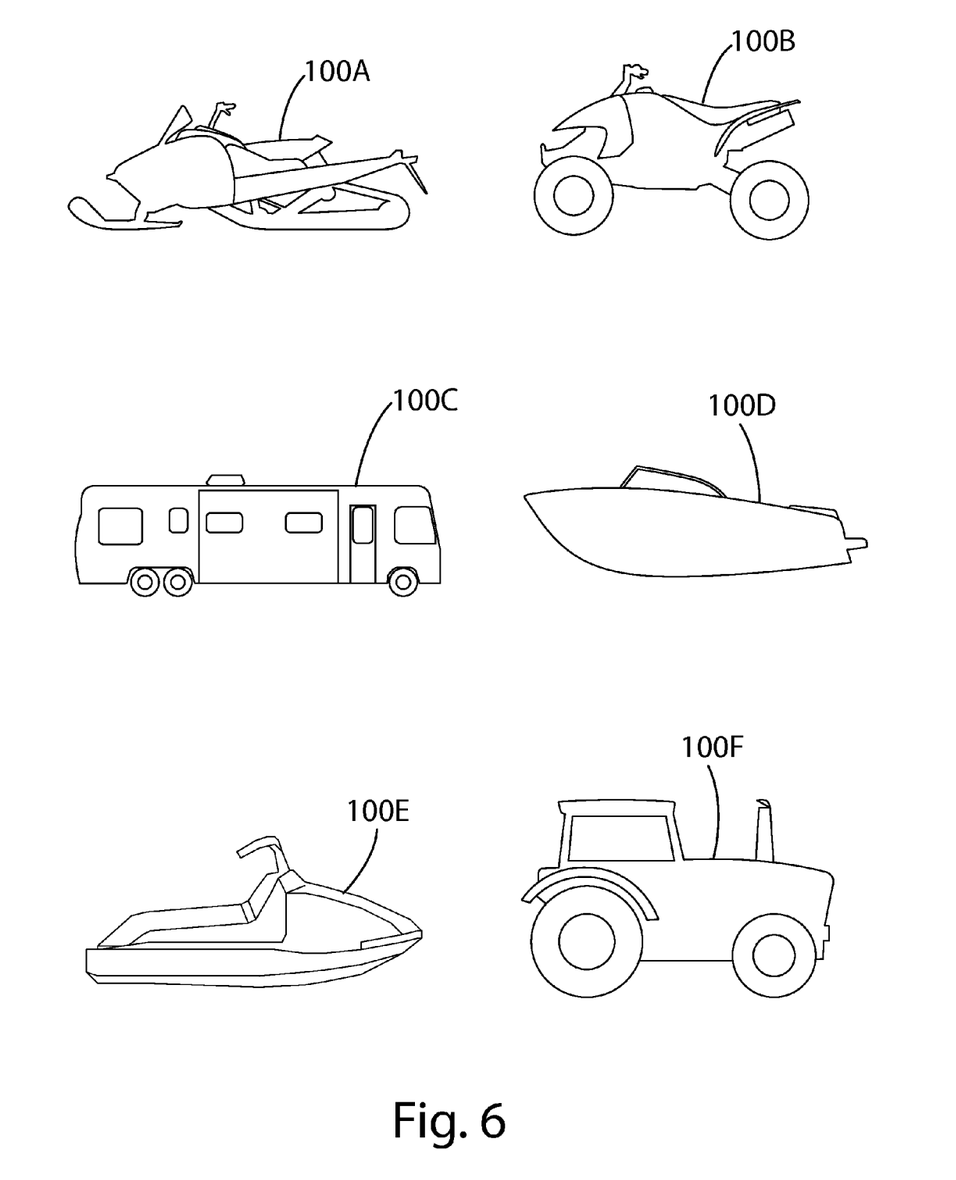
FIG. 6 is a perspective view of alternative recreational vehicles with which the port of the current embodiment can be utilized.

As shown in FIGS. 5 and 6, the power port can be used or included on any type of recreational or other vehicle, such as a snowmobile 100A, an off road vehicle 100B, a recreational motorhome 100C, a watercraft or boat 100D, a personal watercraft 100E, a tractor 100F, or any other type of vehicle that may include a power port or plug. Generally these items can include an electrical system and a battery 102. A power port can be in electrical communication with the electrical system and/or battery 102. The vehicle 100 can also include one or more mobility elements such as wheels 104 that are generally mounted to a frame 107. The mobility elements can be configured to enable the vehicle to traverse terrain. Although shown as wheels 104 in FIG. 5, the mobility elements can be in the form of skis, tracks and/or a hull joined with the frame to enable the vehicle to traverse terrain and/or water, as shown in FIG. 6. The vehicle 100 as mentioned above, can include a panel 105 that defines a panel hole 105H though which the power port 10 is placed. The power port can be placed adjacent other gauges 105G on the panel so that a viewer can readily monitor the state of charge of the battery 102 of the vehicle while charging or powering an external item 108.

A method of powering and/or charging a device also is provided. An example is shown in FIG. 4. There, a connector 109 of a device or item 108 can be plugged into the power port 10 and mounted on a vehicle 100. The power port 10 can include the state of charge gauge 40. The electrical system and/or battery 102 of the vehicle can be utilized to transfer voltage or electrical current through the power port 10 with the connector 109 and ultimately to the item or device 108 to charge or power that item. As this occurs, the status of the battery on the vehicle (versus the status of the item's battery) is output via the gauge 40 selectively illuminating the lighting elements 43. During this activity, a viewer can monitor the status of the charge of the battery via the gauge 40 to insure the battery is not inadvertently drained or overtaxed. This can prevent the user from being stranded in a remote location in situations where the user is located.

Optionally, the circuitry 40C of the gauge 40 can include an automatic override. With this override, instead of automatically engaging in a passive status mode, the gauge 40 and circuitry can automatically prevent the charging of an item when a connector 109 is plugged into the socket 12, for example, when the battery 102 is already low, such as below 35%, or 25%, 15% or lower, to prevent further inadvertent draining of the battery.

Figure 8:
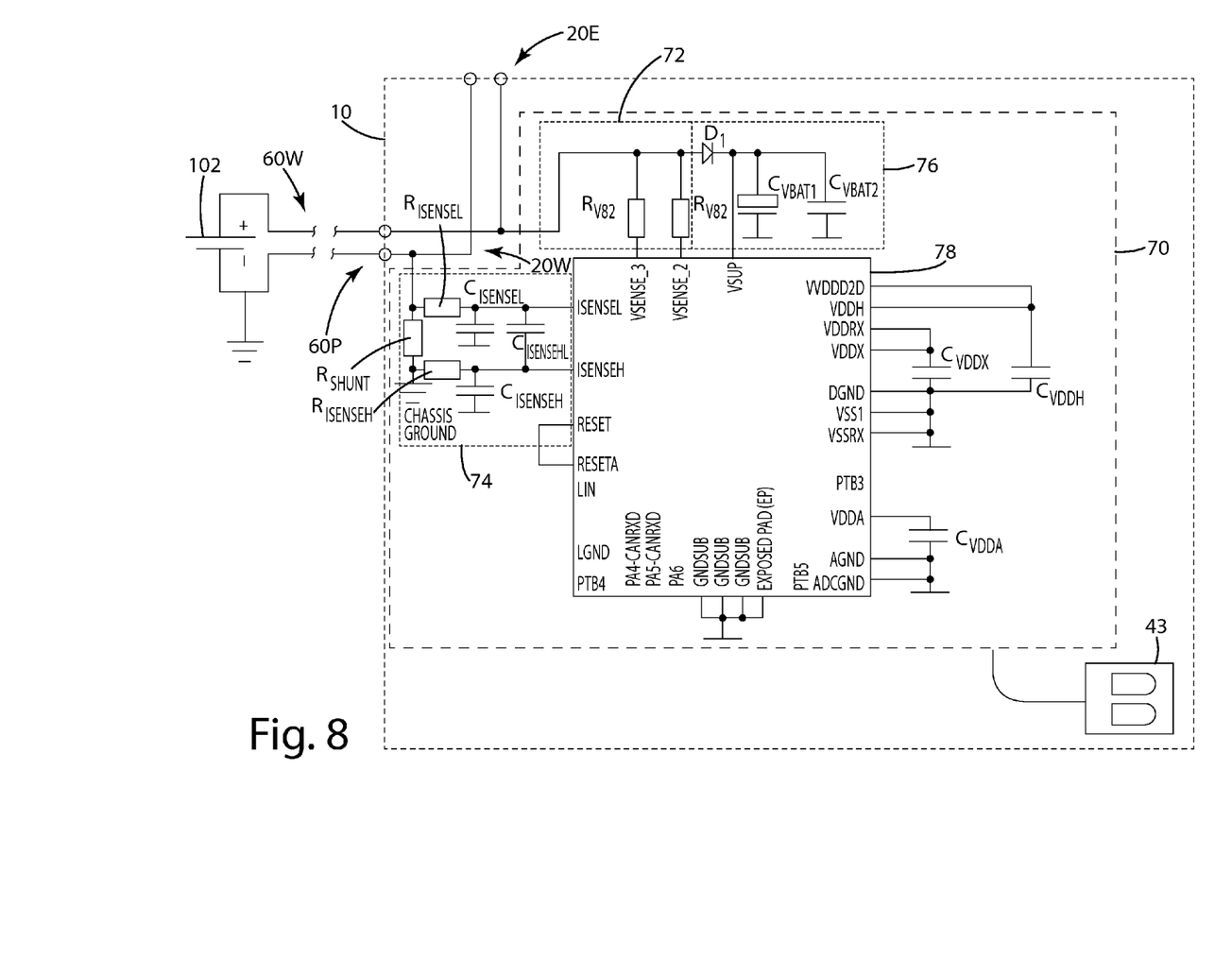
FIG. 8 is a representative view of circuitry of the current embodiment of the power port.

Turning now to the illustrated embodiment of FIG. 8, circuitry of the power port according to one embodiment is shown. The power port in the illustrated embodiment may be similar to the power port 10 described herein, and likewise is designated 10. It should be understood that the circuitry described in connection with the illustrated embodiment of FIG. 8 can be utilized in connection with alternative embodiments, and that features from one or more embodiments described herein can be incorporated into the illustrated embodiment. In addition to or alternatively, features of the illustrated embodiment can be absent depending on the application.

In the illustrated embodiment, the power port 10 can include electrodes 20E in electrical communication with the vehicle battery 102 via the wiring 20W and external wiring 60W. The external wiring 60W and the wiring 20W of the power port 10 can be in electrical communication with each other through any type of connection, such as the plug 60P and a receptacle, or direct connections. The electrodes 20E can enable an external item to receive power from the vehicle battery 102 via the power port 10. Optionally, as described herein, the electrodes 20E can be selectively coupled to the external wiring 60W to selectively enable or disable transmission of power to an external item based on one or more battery conditions, such as a low battery condition, and to potentially prevent the external item from inadvertently draining the battery. To facilitate this selective coupling, a battery state monitor 70 can control a switch (not shown) disposed between one or both electrodes 20E and the external wiring 60W.

The power port 10 can include a battery state monitor 70 configured to monitor the state of the vehicle battery 102 through a connection to the wiring 20W of the power port 10. In this way, the battery state monitor 70 can remotely monitor the state of the vehicle battery 102 rather than monitoring the state by being in direct proximity to the vehicle battery 102 or utilizing a direct connection to a lug or terminal of the vehicle battery 102. With the ability to remotely monitor the state of the vehicle battery 102, the power port 10 can utilize existing vehicle wiring or conventional power port interfaces. This configuration can enable inclusion of a state of charge and/or a state of health monitor in a vehicle with little or no modifications to the vehicle or vehicle design. For example, the power port 10 can be configured to use the same standard hole and space for mounting a conventional 12V power port. This way, the power port 10 can be included in the vehicle with little or no modification to the vehicle or vehicle design. As another example, by utilizing existing vehicle wiring or conventional power port connections, a vehicle can be fitted with a battery gauge according to one embodiment without disposing a conventional battery monitor in direct proximity to the vehicle battery 102 and incorporating additional external wiring to communicate state information from such a conventional battery monitor.

The battery state monitor 70 in the illustrated embodiment can determine a battery state by monitoring a voltage of the wiring 20W in electrical communication with the vehicle battery 102. For example, as shown in the illustrated embodiment, the battery state monitor 70 can include a battery sensor integrated circuit (IC) 78 and voltage sensor circuitry 72 in electrical communication with the wiring 20W, which in turn is in electrical communication with the positive terminal of the vehicle battery 102. The voltage sensor circuitry 72 in the illustrated embodiment enables internal voltage sensor circuitry of the battery sensor IC 78 to sense a voltage on the positive terminal of the vehicle battery 102 via the wiring 20W. The voltage sensor circuitry 72 in the illustrated embodiment includes (a) a direct connection to the wiring 20W and (b) a current limiting resistor to potentially protect the internal voltage sensing circuitry of the battery sensor IC 78 from over voltage conditions. Additionally or alternatively, the voltage sensor circuitry 72 can include filter circuitry to reduce or prevent noise from affecting the ability of the battery state monitor 70 to monitor the voltage. Although the voltage sensor circuitry 72 in the illustrated embodiment can allow the internal voltage sensor circuitry of the battery sensor IC 78 to communicate with and sense the battery terminal voltage, in an alternative embodiment, the voltage sensor circuitry 72 can sense the battery terminal voltage and communicate this information to the battery sensor IC 78. In this alternative embodiment, the battery sensor IC 78 may not include internal voltage sensor circuitry.

In the illustrated embodiment, the battery state monitor 70 includes power conditioning circuitry 76 adapted to receive power from the wiring 20W, and condition the power for circuitry of the battery state monitor 70, such as the battery sensor IC 78. For example, the power conditioning circuitry 76 can include a reverse voltage protection diode to potentially prevent incorrect electrical connections from damaging circuitry of the battery state monitor 70. The power conditioning circuitry 76 can also include decoupling capacitance to reduce adverse effects potentially caused by noise and voltage shifts. In the illustrated embodiment, the battery sensor IC 78 is a Freescale MM9Z1_638 intelligent battery sensor with CAN and LIN interfaces. However, it should be understood that the present invention is not limited to this specific construction, and that alternative circuitry can be utilized for the battery state monitor 70.

In one embodiment, the battery state monitor 70 can optionally include or communicate with current sensor circuitry 74 coupled between two circuit nodes: (A) chassis ground and (B) a portion of the wiring 20W in communication with the negative terminal of the vehicle battery 102. The current sensor circuitry 74 can be configured such that the chassis ground at node A is the only ground connection for the negative terminal of the vehicle battery 102. This way, all current through the negative terminal can flow through the current sensor circuitry 74 allowing the current sensor circuitry 74 to evaluate the amount of current output from the vehicle battery 102. Including the amount of current through the vehicle battery 102 in the determination of battery state of charge (BSOC) or battery state of health (BSOH), or both, can in some cases help to compensate for effects on the voltage output from the vehicle battery 102 due to changes in vehicle operation. For example, the voltage output from the vehicle battery 102 can depend on whether the engine is running.

In another optional embodiment, the current sensor circuitry 74 can be an inductive sensor or inductive clamp configured to sense an amount of current through at least one of the negative and positive terminals of the vehicle battery 102. As an example, the inductive sensor can be disposed such that all current through the vehicle battery 102 flows through a conductor around which the inductive sensor is disposed. The inductive sensor can be directly around the negative terminal or around a wire connected to the negative terminal without breaking a connection between the wire and the negative terminal.

In the illustrated embodiment, the current sensor circuitry 74 can be included in the battery state monitor 70 of the power port 10. Alternatively, the current sensor circuitry 74 can be external or separate from the battery state monitor 70 and the power port 10. For example, the current sensor circuitry 74 can be disposed in direct contact with the vehicle battery 102 and connected to the negative terminal thereof, and can communicate sensed information to the battery state monitor 70 located in the power port 10. Communication can be performed in a variety of ways, including, for example, a control signal representative of a high or low state and binary data communicated in a serial manner.

The battery state monitor 70 can optionally include temperature sensor circuitry (not shown) configured to monitor a temperature of the vehicle battery 102. The temperature sensor circuitry can be in direct contact with the battery to aid in obtaining an accurate temperature reading.

The current sensor circuitry 74 or the temperature sensor circuitry, or both, can provide information that aids in determining the state of the vehicle battery 102. For example, the current sensor circuitry 74 can provide information regarding total vehicle battery current, and the temperature sensor circuitry can provide information regarding the battery temperature. This information can be used to enhance accuracy in determining the state of the battery, such as degree of charge or discharge, or both, and can also be used to enhance accuracy in determining a state of health of the battery. The state of health of the battery can indicate whether the battery is ready to be replaced. By communicating state of health information to a vehicle operator, a decision about whether to replace the battery can be made prior to using the vehicle, thereby potentially avoiding the possibility of becoming stranded due to a battery fault.

In one embodiment, the sensed information obtained by the battery state monitor 70, such as information obtained from the current sensor circuitry 74, the voltage sensor circuitry 72 or the temperature sensor circuitry, or a combination thereof, can be used as a basis for detecting operating parameters of the vehicle and vehicle conditions. Operating parameters and vehicle conditions determined by the battery state monitor 70 can include or be related to diagnostics of vehicle components, such as engine diagnostics, alternator diagnostics, starter diagnostics, and electrical system diagnostics. The diagnostic information can include failure conditions with respect to one or more of these or other vehicle components. For example, the battery state monitor 70 can use the total vehicle battery current or the battery temperature, or both, in determining diagnostic information about the engine.

In the illustrated embodiment, the current sensor circuitry 74 includes a shunt resistor between nodes A and B that provides a known voltage drop for a given amount of current. In other words, the voltage across the resistor depends on the amount of current through the shunt resistor. By monitoring this voltage, the battery sensor IC 78 can determine the amount of current through the shunt resistor. In the illustrated embodiment, the current sensor circuitry 74 further includes conditioning circuitry between nodes A and B of the shunt resistor and internal sensor circuitry of the battery sensor IC 78. It should be understood, however, that the present invention is not limited to the specific circuit configuration of the illustrated embodiment, and that the battery state monitor 70 can include any circuit type or configuration capable of monitoring the state of the battery.

The battery state monitor 70 can be coupled to and control operation of an indicator, such as one or more lighting elements 43. Based on the state of the battery determined via at least one of the voltage sensor circuitry 72 and the current sensor circuitry 74, the battery state monitor 70 can selectively illuminate the one or more lighting elements 43. For example, in one embodiment in which the one or more lighting elements 43 form an array of LEDs about the circumference of the power port 20 visible to a vehicle operator, the battery state monitor 70 can selectively power all of the LEDs based on a determination that the charge state is fully charged. Additionally, based on a determination that the battery state is a percentage less than full charge or less than 100% charge, the battery state monitor 70 can selectively power a number of the LEDs that corresponds generally to the determined percentage. For purposes of disclosure, the battery state monitor 70 is described in conjunction with operating one or more lighting elements 43; however, as described herein, any type of indicator or combination of indicators can be coupled to or controlled, or both, by the battery state monitor 70. For example, the battery state monitor 70 can interface with an LED display, an LED array, a liquid crystal display (LCD), a mechanical gauge, an audible indicator, a haptic indicator, a thin film transistor (TFT) display, or a combination thereof. Through the indicator, the battery state monitor 70 can provide a vehicle operator information such as a battery state of charge and/or battery state of health.

In the illustrated embodiment, the battery sensor IC 78 of the battery state monitor 70 can include an integrated programmable controller and integrated memory capable of being configured to both monitor the battery state of the vehicle battery 102 and interface with an indicator to provide information, such as battery related information including, for example, at least one of battery state of charge and battery state of health. In one embodiment, the indicator can include one or more lighting elements 43, which can be selectively activated by the battery state monitor 70. The method or process implemented by the programmable controller can include sensing the voltage of the vehicle battery 102 via the voltage sensor 72, and determining the battery state of charge based on the sensed voltage. In one embodiment, the function or algorithm used to determine a battery state of charge or battery health can be provided by the battery manufacturer or based on specifications provided by the battery manufacturer. As outlined herein, the function or algorithm can utilize the sensed voltage of the battery 102 to determine battery characteristics, such as battery state of charge or battery state of health, or both. Alternative or additional parameters can be used in the function or algorithm. For example, battery current, temperature, battery chemistry and battery geometry can be used in the determination of battery characteristics, such as the battery state of charge or battery state of health, or both.

In one embodiment, the battery state monitor 70 can be in electrical communication with the vehicle battery 102 as long as the vehicle battery is present, and regardless of whether the vehicle is running. This configuration can enable the battery state monitor 70 to continuously track the state of the vehicle battery 70. Continuous monitoring can allow use of new battery conditions, as they are detected, for on-going state of charge determinations.

Although the battery state monitor 70 of the illustrated embodiment is described in connection with a battery sensor IC 78 having an integrated controller and memory, it should be understood that one or more embodiments described herein are not so limited. The battery state monitor 70 can include a control system formed of separate integrated circuits, each capable of all or some of the features described herein. For example, the battery state monitor 70 can include a dedicated battery sensor IC in communication with a separate controller capable of receiving battery state information and controlling display of information via an indicator, such as by selectively activating the one or more lighting elements 43.

Figure 9:
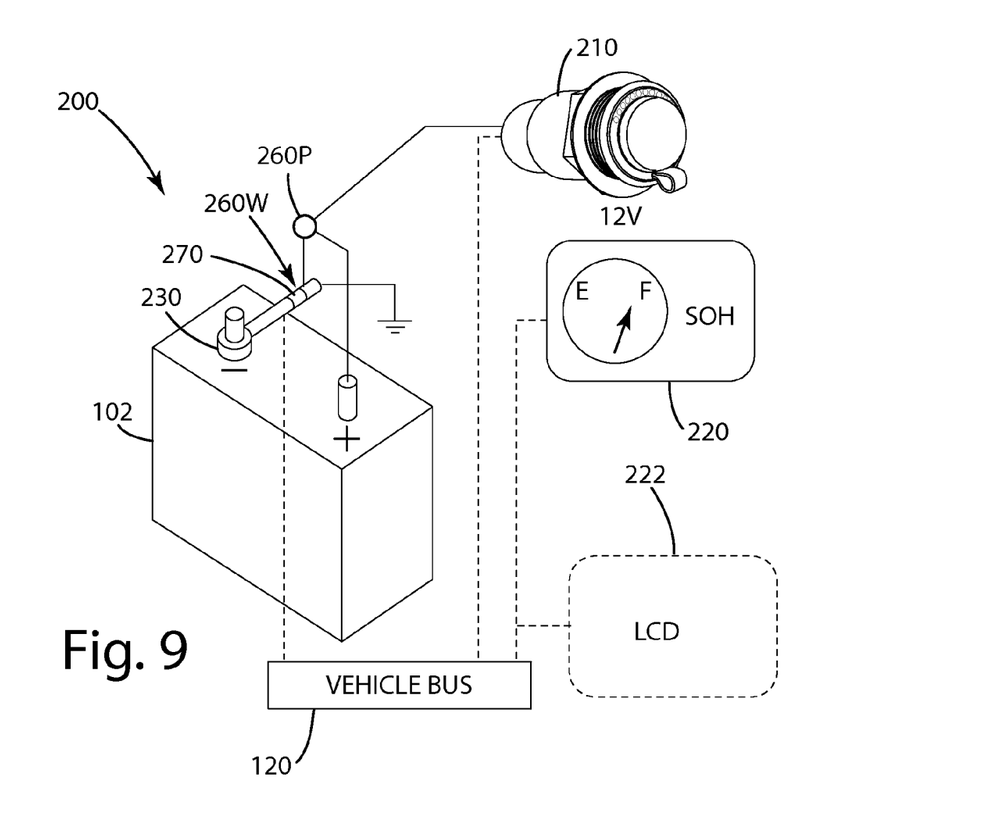
FIG. 9 is a representative view of a second alternative embodiment.

In the illustrated embodiment of FIG. 9, a battery indicator system 200 is shown having a power port and a separate battery monitor, which are respectively designated 210 and 230. The power port 210 in the illustrated embodiment can be similar to the power port 10 described herein, but with several exceptions. For example, the power port 210 can be connected to external wiring 260W via a plug 260P similar to the external wiring 60W and plug 60P described in connection with the power port 10. The power port 210 can also include an indicator, such as one or more lighting elements similar to the one or more lighting elements 43 described herein, enabling indication of battery state of charge. In the illustrated embodiment of FIG. 9, the power port 210 may not include a battery monitor, and instead may communicate with a battery state monitor 270 of the battery clamp 230 to receive and indicate information related to a battery characteristic. Communication between the power port 210 and the battery clamp 230 can be achieved through the external wiring 260W, such as wiring that enables a serial data interface or by transmission of control signals. In an alternative embodiment, the power port 210 may not include the one or more lighting elements or indicate information related to a battery characteristic. In one example of such a configuration, the power port 210 can be a conventional power port.

The battery indicator system 200 of the illustrated embodiment can include a battery clamp 230 mounted directly to the negative terminal of the vehicle battery 102. The battery clamp 230, in one embodiment, can provide a single point connection between the negative terminal and chassis ground so that, by sensing current through the single point connection, all current or total current through the vehicle battery 102 can be monitored. The battery clamp 230 can include a battery state monitor 270 similar to the battery state monitor 70 described herein, and having voltage sensor circuitry 72, current sensor circuitry 74, and temperature sensor circuitry, or a subset thereof. Like the battery state monitor 70, the battery state monitor 270 can determine state of charge information or state of health information, or both, with respect to the vehicle battery 102. The single point connection to chassis ground can enable the current sensor circuitry 74 of the battery state monitor 270 to detect the total amount of current through the vehicle battery 102. The shunt resistor of the current sensor circuitry 74 in this embodiment can be a manufactured component that forms part of the battery clamp 230. For example, the battery clamp 230 can be manufactured to include a metal portion used as a shunt resistor, and through which current flows to the chassis ground. Characteristics of the metal portion, such as its resistance, can be controlled at the design stage or during manufacture, or both, so that the current sensor circuitry 74 can obtain a generally accurate and repeatable measure of current. Use of a manufactured component as a shunt resistor can help to reduce overall cost of the battery clamp 230, and can also provide a mechanical mounting point for the current sensor circuitry 74. It should be understood, however, that the present application is not limited to use of a manufactured component for the shunt resistor. The shunt resistor can be any type of resistive component, including, for example, a discrete element (e.g., a current sense resistor) mounted to the battery clamp 230.

As described herein, the battery clamp 230 can be connected directly to the post of the negative terminal. The battery clamp 230 can also be electrically connected to the positive terminal via external wiring 260W. This way, the battery clamp 230 can compare potential across the negative and positive terminals, and sense battery voltage. In the illustrated embodiment, because the battery state monitor 270 is in close proximity to the vehicle battery 102, the voltage sensed by the voltage sensor circuitry 72 can be a more accurate representation of the actual voltage across the vehicle battery 102. For example, measurements of voltage that are remote from the battery can be affected by voltage drops or fluctuations that occur between the voltage sensor circuitry 72 and the vehicle battery 102. Such voltage drops or fluctuations can be caused by changes in power drawn through the conductor through which the voltage sensor circuitry 72 measures voltage.

The battery indicator system 200 according to one embodiment can be configured to provide information regarding battery state of health, as described herein. In the illustrated embodiment, the determination of battery state of health can be conducted by the battery state monitor 270 of the battery clamp 230. The battery state monitor 270 in this embodiment can include temperature sensing circuitry to sense the internal temperature of the vehicle battery 102. For example, the battery clamp 230 can detect the internal temperature via the post of the negative terminal on which the battery clamp 230 is connected. In this way, the battery clamp 230 can operate as a thermal probe separate from or outside of a battery charging circuit (not shown) of the vehicle. According to one embodiment, the electronics of the battery clamp 230, including the battery state monitor 270, can be integrated into the construction of the battery clamp 230.

The battery indicator system 200, in one embodiment, can use the sensed internal temperature of the vehicle battery 102 as a basis for determining information related to the battery state of health or the battery state of charge, or both. The sensed internal temperature can aid in understanding the health of the battery and the state of charge. For example, the sensed internal temperature can enable the battery state monitor 270 to compensate for different modes of vehicle operation (e.g., whether the engine is running or stopped) that may affect the battery voltage or battery output current, or both. In one embodiment, with an understanding of battery state of health and battery state of charge, the battery indicator system 200 can advise a vehicle operator about battery characteristics (e.g., amount of charge) and provide information related to battery state of health, such as whether to replace the battery, or the amount of time until replacement is recommended.

The battery indicator system 200 in the illustrated embodiment can be configured such that one or more components are coupled to a vehicle bus 120 of the vehicle. As an example, the vehicle bus 120 can include a local interconnect network (LIN) bus or a controller area network (CAN) bus, or a combination thereof. As shown in phantom lines in the illustrated embodiment of FIG. 9, one or more of the battery clamp 230, the power port 210 and one or more indicators can optionally interface with the vehicle bus 120. As mentioned herein, the battery clamp 230 can communicate with the power port 210 via the external wiring 260W. In addition to or alternative to this configuration, communication between the battery clamp 230 and the power port 210 can be achieved through the vehicle bus 120.

The battery clamp 230 in the illustrated embodiment can communicate battery related information, such as information related to battery state of charge or battery state of health, or both, for display on one or more indicators, such as indicator 220. The battery related information can be communicated via the vehicle bus 120, as shown in the illustrated embodiment. However, the present application is not so limited; alternatively or additionally, battery related information can be communicated from the battery clamp 230 to the indicator via a connection separate from the vehicle bus 120. For example, battery related information can be communicated via a wired interface separate from the vehicle bus 120 and solely dedicated to communicating battery related information.

In the illustrated embodiment, the battery indicator system 200 includes an indicator 220 capable of receiving communication of battery related information from the battery clamp 230. The indicator 220 in the illustrated embodiment communicates via the vehicle bus 120, and can display battery state of charge information and battery state of health information. For example, the indicator 220, based on the received battery related information, can indicate to a vehicle operator the current charge level of the vehicle battery 102, and the health of the vehicle battery 102. As another example, in response to the battery clamp 230 communicating battery related information indicating the vehicle battery 102 may be near its end of life and may be worth replacing, the indicator 220 can display an indication to replace the vehicle battery 102. In this way, the vehicle operator can be allowed to make an informed decision about whether to replace the vehicle battery 102 before embarking on a trip. It should be understood that the present application is not limited to the specific type of indicator 220 in the illustrated embodiment, and that any type of indicator or display can be used in conjunction with the battery clamp 230. An example alternative indicator is shown in phantom in the illustrated embodiment of FIG. 9, and generally designated 222. The indicator 222 is an LCD display capable of displaying the battery related information and communicating messages or alerts to the vehicle operator. As another example, the indicator can form part of an indicator system that communicates information unrelated to the battery.

Figure 11:
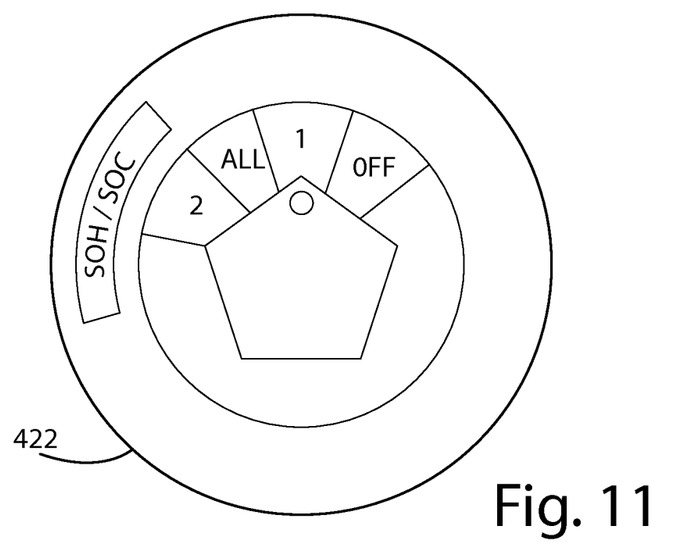
FIG. 11 is a representative view of an indicator according to one embodiment.

In one embodiment, features of the indicator 220 can be incorporated into a battery switch of the vehicle. An example of such a battery switch is shown in FIG. 11, and generally designated 422. In the illustrated embodiment, the battery switch 422 is capable of selecting among multiple batteries for powering the vehicle. The battery switch 422 can be included in any type of vehicle, including, for instance, a boat or a recreational vehicle (RV). In this context, the battery switch 422 can be a common touch point for a vehicle operator prior to starting the vehicle engine. With indicator capabilities, as discussed herein, the battery switch 422 can provide a vehicle operator with battery related information, such as battery state of health or battery state of charge, or both, before the vehicle operator begins traveling with the vehicle. In one embodiment, as discussed in further detail herein, the battery switch 422 can be configured to automatically select between multiple power sources based on information relating to one or more of the multiple power sources.

It should be understood that the circuitry described in connection with the illustrated embodiments of FIGS. 9 and 11 can be utilized in connection with alternative embodiments, and that features from one or more embodiments described herein can be incorporated into the illustrated embodiment. In addition to or alternatively, features of the illustrated embodiment can be absent depending on the application.

Figure 10:
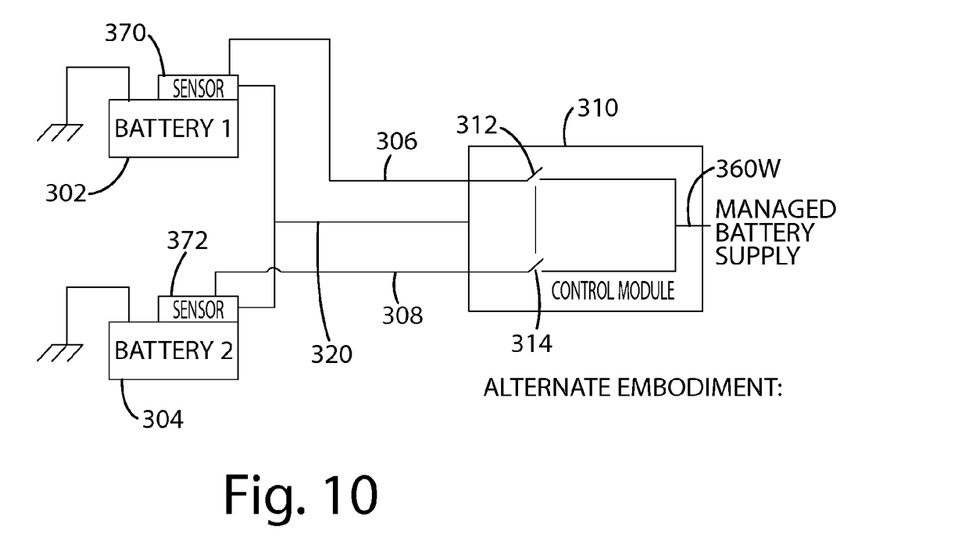
FIG. 10 is a representative view of a third alternative embodiment including multiple power sources.

In the illustrated embodiment of FIG. 10, a battery control system is shown, and generally designated 300. The battery control system 300 can facilitate transitioning from one power source to another. For example, in the context of a power source being a battery, when the battery becomes weak or depleted, the battery control system 300 can transition from using that battery as a power source to another power source or a secondary battery. In the illustrated embodiment, the battery control system 300 can include at least two power sources 302, 304 and a control module 310 configured to selectively couple vehicle wiring 360W to at least one of the power sources 302, 304. Each of the at least two power sources 302, 304 can be connected respectively to power switches 312, 314 via wires 306, 308. The power switches 312, 314 can be selectively activated and deactivated by the control module 310 to selectively couple the at least one power source 302, 304 to the vehicle wiring 360W. In this way, the control module 310 can provide a managed power source to the vehicle wiring 360W.

In the illustrated embodiment, the power switches 312, 314 are shown incorporated within the control module 310. However, it should be understood that the present disclosure is not so limited, and that the power switches 312, 314 can be located remotely from the control module 310. In this remote configuration, the power switches 312, 314 can be selectively activated and deactivated via communication, such as a control signal or data, from the control module 310.

The battery control system 300 can include one or more battery state monitors 370, 372 configured similar to the battery state monitor 270 described in connection with the illustrated embodiment of FIG. 9. For instance, the battery state monitor 370 can be constructed in the form of a battery clamp, similar to the battery clamp 230, that is connected to a post or terminal of a power source. The one or more battery state monitors 370, 372 can sense one or more characteristics of a respective power source, such as a battery, and determine battery related information about the respective power source. The battery related information can include state of health information or state of charge information, or both. Additionally, or alternatively, the battery related information can include other information about the respective power source, including, for example, an identifier of the power source or a dynamic characteristic of the power source.

The one or more battery state monitors 370, 372 can communicate at least one of the one or more sense characteristics and battery related information to the control module 310. Communication can occur in any manner, including via a vehicle bus 320 or control signals, or a combination thereof. Based on the battery related information, the control module 310 can automatically select one or more of the at least two power sources 302, 304 to couple to the vehicle wiring 360W. Further, based on the information received from the one or more battery state monitors 370, 372, the control module 310 can disconnect one or more of the at least two power sources 302, 304 from the vehicle wiring 360W, potentially enabling recovery or recharging of the disconnected power source or sources. In this way, for example, the control module 310 can automatically switch off the use of a weak battery or power source so that it can recover while the battery control system 300 uses a fully charged battery or power source to take over supplying power to the vehicle wiring 360W.

In an alternative embodiment, the one or more battery state monitors 370, 372 can be separate from the at least two power sources 302, 304, similar to an embodiment of the battery state monitor 70 described in connection with FIG. 8. In one configuration of this embodiment, the one or more battery state monitors 370, 372 can be selectively coupled to the at least two power sources 302, 304. For example, one battery state monitor 370 can be incorporated into the control module 310, and can be selectively coupled to one of the at least two power sources 302, 304 depending on an activation state of the power switches 312, 314. In this configuration, the one battery state monitor 370 can provide battery related information about a first power source that is coupled thereto. The one battery state monitor 370 can be disconnected from the first power source and coupled to a second power source, thereby enabling the one battery state monitor 370 to provide status information about the second power source.

In the illustrated embodiment, each of the at least two power sources 302, 304 is a battery respectively associated with a battery state monitor 370, 372. It should be understood, however, that the at least two power sources 302, 304 can be any combination of types of power sources, including combinations of the same or different types of power sources. For instance, one of the at least two power sources 302 can be a battery, and another can be a generator.

In an alternative embodiment, the control module 310 can be distributed such that one or more components of the control module 310 can operate independently or in concert with each other, or a combination thereof. Further, the one or more components of the control module 310 can operate in conjunction with another controller, such as an external controller. As an example, switch control circuitry of the control module 310 that controls selective activation and deactivation of the power switches 312, 314 can be incorporated into respective battery state monitors 370, 372. A first battery state monitor 370 can include switch control circuitry that selectively activates the power switch 312 to control supply of power from the power source 302 to the vehicle wiring 360W. A second battery state monitor 372 also can include switch control circuitry that selectively activates the power switch 314 to control supply of power from the power source 304 to the vehicle wiring 360W. The first and second battery state monitors 370, 372, including associated switch control circuitry, can be in communication with each other or another controller, or a combination thereof, to coordinate control over which power source is supplying power to the vehicle wiring 360W.

The battery control system 310 can be incorporated into one or more of the embodiments described herein. For example, the battery control system 310 can be incorporated into a battery switch 422. With this configuration, the battery switch 422 can indicate status information about the at least two power sources 302, 304, including state of health or state of charge, or both. Further, the battery switch 422 can control automatic switching among the at least two power sources 302, 304 to select one or more power sources to couple to vehicle wiring 360W. For instance, the battery switch 422 can switch from a weak primary battery power source to a secondary battery power source that is more fully charged than the weak primary battery power source. Likewise, the battery switch 422 can switch back from the secondary battery power source to the primary battery power source after the primary battery power source has been recharged.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular. Any reference to claim elements as "at least one of X, Y and Z" is meant to include any one of X, Y or Z individually, and any combination of X, Y and Z, for example, X, Y, Z; X, Y; X, Z; and Y, Z.

The embodiments of the invention in which an exclusive property or privilege is claimed are defined as follows:

1. A recreational vehicle comprising:
   a frame;
   a plurality of at least one of a wheel, a track, a hull and a ski joined with the frame and configured to enable the vehicle to traverse at least one of terrain and water;
   a panel joined with the frame;
   an electrical system;
   a battery in electrical communication with the electrical system; and
   a socket in electrical communication with the battery and mounted to the panel, the socket including a longitudinal axis, a housing defining an internal bore sized and shaped to receive a corresponding plug of a connector of an external mobile device, a first and a second end, the first end including a threaded portion;
   an annular ring threadably joined with the threaded portion and configured to engage the panel to maintain the socket in a fixed orientation relative to the panel;
   a state of charge gauge fixedly mounted to the socket at the first end, the gauge in electrical communication with the battery, the gauge including a flange extending radially outward from the longitudinal axis of the socket, the flange having a rear surface adapted to face toward the panel when the annular ring engages the panel and a front surface that faces outward from panel and that is visible to a viewer of the socket, the gauge including an indicator disposed on the front surface of the flange, the gauge operable in a status mode in which the indicator indicates at least one a state of charge of the battery and a state of health of the battery,
   whereby when the connector is plugged into the socket, the battery provides voltage to at least one of charge and power an external mobile device, all while the viewer monitors the status of the charge of the battery via the state of charge gauge to ensure the vehicle battery is not inadvertently drained.

2. The recreational vehicle of claim 1 wherein the indicator includes a plurality of indicating elements.

3. The recreational vehicle of claim 2 wherein the plurality of indicating elements include at least one of an LED, an LCD, a mechanical gauge, an audible indicator, and a haptic indicator.

4. The recreational vehicle of claim 2 wherein the plurality of indicating elements includes a plurality of lighting elements, the gauge operable in the status mode in which the plurality of lighting elements selectively illuminate to indicate the state of charge of the battery.

5. The recreational vehicle of claim 1 wherein the vehicle is at least one of a motorcycle, a utility vehicle, an off road vehicle, a watercraft, a motorhome, a tractor and a snowmobile.

6. The recreational vehicle of claim 4 comprising a wiring harness, the wiring harness extending from the second end of the housing, the wiring harness in electrical communication with the gauge to supply power to and illuminate the plurality of lighting elements.

7. The recreational vehicle of claim 4 wherein the plurality of lighting elements are disposed along an arc that extends about a portion of the bore.

8. The recreational vehicle of claim 7 wherein the plurality of lighting elements are disposed on a support bored that is included in the flange.

9. The recreational vehicle of claim 8 wherein the state of charge gauge illuminates a different number of the lighting elements when the battery charge is low than when the battery charge is high.

10. The recreational vehicle of claim 8 wherein the flange defines a recess within which the plurality of lighting elements are disposed.

11. The recreational vehicle of claim 10 wherein the flange includes a transparent window, disposed adjacent the recess, and covering the plurality of lighting elements to protect the lighting elements from the environment.

12. The recreational vehicle of claim 1 comprising a plug installed in the socket, the plug including at least one industry standard connection element.

13. The recreational vehicle of claim 1 wherein the at least one industry standard connection element includes at least one USB connection element.

14. The recreational vehicle of claim 1 comprising trim element circumferentiating the flange.

15. The recreational vehicle of claim 14 wherein the panel defines a hole, wherein the socket extends at least partially through the hole, wherein the trim element conceals the hole from a viewer of the panel.

16. The recreational vehicle of claim 1 wherein the gauge includes circuitry that determines the state of charge of the battery and a state of health of the battery.

17. The recreational vehicle of claim 1 wherein the gauge is void of alphanumeric output lighting elements.

18. A power port for a vehicle comprising:
   a socket in electrical communication with a power source on a vehicle, the socket including a longitudinal axis, and a housing defining an internal bore sized and shaped to receive a corresponding plug of a device;

a moveable element joined with the socket and configured to maintain the socket in a fixed orientation relative to the vehicle; and a state of charge gauge joined with the socket, the gauge in electrical communication with the power source on the vehicle, wherein the gauge includes an indicator, wherein the gauge is operable in a status mode in which the indicator selectively illuminates to indicate at least one of the state of charge of the power source on the vehicle and the state of health of the power source, and whereby when a device to be at least one of charged and powered is associated with the socket, the power source provides voltage to the device to at least one of charge and power the device, and provides voltage to the gauge so that the viewer can monitor the status of the charge of the power source via the gauge to ensure the power source is not inadvertently drained.

19. The power port of claim 18 wherein the indicator includes at least one lighting element.

20. The power port of claim 19 wherein the gauge includes empty and full indicia elements, wherein the gauge illuminates the lighting element adjacent the empty and full indicia elements.

21. The power port of claim 19 wherein the gauge includes a flange defining a window, wherein the lighting element is visible through the window.

22. The power port of claim 18 wherein the gauge includes a flange that circumferentiates the bore, wherein the flange extends radially outward from the longitudinal axis a distance sufficient to conceal a hole through which the socket is disposed.

23. The power port of claim 19 wherein the gauge includes circuitry to output the status of charge of the power source via the lighting element.

24. A battery indicator system for a recreational vehicle, the recreational vehicle having a battery with a negative terminal and a positive terminal, the battery indicator system comprising:

a battery clamp mounted to the negative terminal of the battery and having a battery monitor configured to monitor one or more characteristics of the battery, said battery monitor configured to determine at least one of a battery state of charge and a battery state of health based on said one or more monitored characteristics of the battery, said battery clamp capable of communicating battery related information for display on an indicator;

wherein said battery related information is indicative of said at least one of said battery state of charge and said battery state of health;

wherein said battery clamp provides a ground connection between the negative terminal of the battery and a vehicle chassis ground;

wherein said battery monitor includes a resistive element in the electrical path between the negative terminal and the vehicle chassis ground such that a total current output from the battery flows through said resistive element;

wherein said battery monitor includes current sense circuitry coupled to said resistive element to determine said total current output from the battery; and wherein said battery state of charge and said battery state of health are determined based on the total current output from the battery.

25. The battery indicator system of claim 24 wherein said one or more monitored characteristics include a battery temperature, a battery voltage across the positive and negative terminals, and a battery current between the negative terminal and the vehicle chassis ground.

26. The battery indicator system of claim 24 wherein said resistive element is an integrated component of the battery clamp.

27. The battery indicator system of claim 24 wherein the battery monitor is configured to sense the battery temperature via a temperature sensor coupled directly to the negative terminal of the battery.

28. The battery indicator system of claim 24 wherein the battery indicator system includes said indicator, wherein said indicator is configured to display information indicative of said battery state of charge and said battery state of health, wherein said battery clamp communicates said battery related information to said indicator via a vehicle bus.

29. The battery indicator system of claim 24 further comprising:

a battery control system capable of controlling respective connections of multiple batteries to a managed battery supply that is coupled to vehicle wiring; and wherein the battery monitor is configured to monitor each of the multiple batteries to provide said at least one of said battery state of charge and said battery state of health.

30. The battery indicator system of claim 29 further comprising a battery selection switch system capable of selecting which of the multiple batteries is coupled to the managed battery supply, the battery selection switch system configured to automatically connect one battery of the multiple batteries to connect to the managed battery supply based on said at least one of said battery state of charge and said battery state of health, wherein the battery selection switch includes an indicator configured to display information related to said at least one of said battery state of charge and said battery state of health.

* * * * *